(12) United States Patent
Murayama

(10) Patent No.: US 10,923,532 B2
(45) Date of Patent: Feb. 16, 2021

(54) MAGNETIC MEMORY DEVICE

(71) Applicant: Toshiba Memory Corporation, Tokyo (JP)

(72) Inventor: Akiyuki Murayama, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 249 days.

(21) Appl. No.: 15/268,459

(22) Filed: Sep. 16, 2016

(65) Prior Publication Data

US 2017/0263851 A1    Sep. 14, 2017

Related U.S. Application Data

(60) Provisional application No. 62/306,309, filed on Mar. 10, 2016.

(51) Int. Cl.
*H01L 43/02* (2006.01)
*H01L 27/22* (2006.01)

(52) U.S. Cl.
CPC .................. *H01L 27/228* (2013.01)

(58) Field of Classification Search
CPC ... H01L 27/222; H01L 27/224; H01L 27/228; H01L 43/02; H01L 43/08; H01L 43/10; H01L 43/12; H01L 23/3731; H01L 23/3738; H01L 27/226; H01L 27/11512; H01L 27/11548; H01L 27/11575; H01L 27/11595; H01L 27/2481
See application file for complete search history.

(56) References Cited

U.S. PATENT DOCUMENTS

| | | | |
|---|---|---|---|
| 6,936,763 B2 | 8/2005 | Rizzo et al. | |
| 8,373,256 B2 * | 2/2013 | Kaneko | H01L 23/5225 257/659 |
| 8,513,751 B2 | 8/2013 | Asao | |
| 8,664,010 B2 | 3/2014 | Matsubara | |
| 2007/0164265 A1 | 7/2007 | Kajiyama | |
| 2012/0193601 A1 * | 8/2012 | Tsukamoto | G11C 11/16 257/5 |
| 2014/0264668 A1 * | 9/2014 | Lee | H01L 43/12 257/421 |
| 2014/0284738 A1 | 9/2014 | Nakazawa et al. | |
| 2017/0092847 A1 * | 3/2017 | Kim | G11C 11/161 |
| 2017/0222128 A1 * | 8/2017 | Sung | H01L 43/12 |

FOREIGN PATENT DOCUMENTS

JP    2004296515 A   * 10/2004   ....... H01L 21/76801

* cited by examiner

*Primary Examiner* — Cuong Q Nguyen
*Assistant Examiner* — Peter M Albrecht
(74) *Attorney, Agent, or Firm* — Holtz, Holtz & Volek PC

(57) ABSTRACT

According to one embodiment, a magnetic memory device includes a semiconductor substrate, a first lower area provided on the semiconductor substrate, and including a plurality of magnetoresistive effect elements, a second lower area provided on the semiconductor substrate, and being adjacent to the first lower area, a first upper area provided above the first lower area, and including a first material film formed of an insulating material or a semiconductor material, and a second upper area provided above the second lower area, being adjacent to the first upper area, and including a second material film formed of an insulating material different from a material of the first material film.

26 Claims, 10 Drawing Sheets

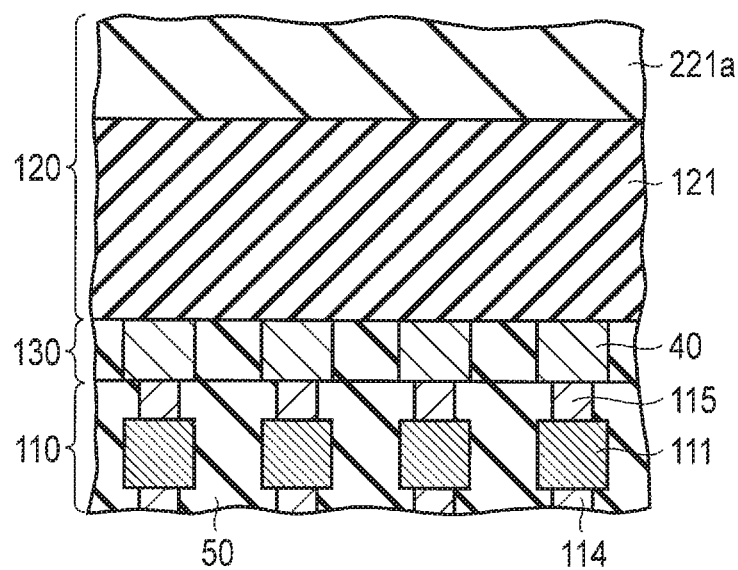
F I G. 4
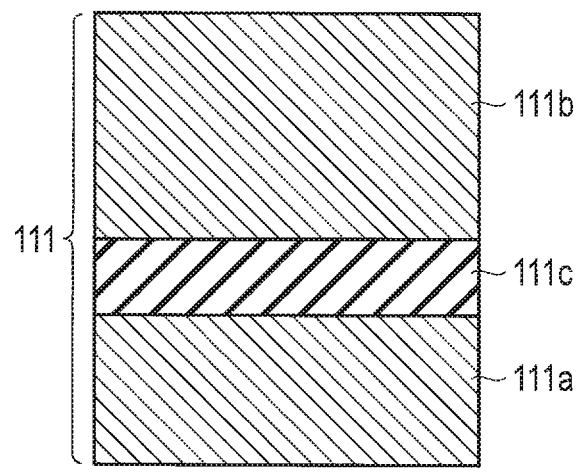
F I G. 5

US 10,923,532 B2

MAGNETIC MEMORY DEVICE

CROSS-REFERENCE TO RELATED APPLICATIONS

This application claims the benefit of U.S. Provisional Application No. 62/306,309, filed Mar. 10, 2016, the entire contents of which are incorporated herein by reference.

FIELD

Embodiments described herein relate generally to a magnetic memory device.

BACKGROUND

A magnetic memory device (semiconductor integrated circuit device) having transistors and magnetoresistive effect elements integrated on a semiconductor substrate has been proposed.

In the aforementioned magnetic memory device, heat produced in a magnetoresistive effect element during a write operation may adversely affect the reliability of the magnetoresistive effect element. In particular, the smaller the size of the magnetoresistive effect element becomes, the greater a problem of heat produced in the magnetoresistive effect element becomes.

BRIEF DESCRIPTION OF THE DRAWINGS

FIG. 4 is a cross-sectional view which schematically shows a structure of the magnetic memory device according to the first embodiment.

FIG. 5 is a cross-sectional view which schematically shows a basic structure of a magnetoresistive effect element according to the first embodiment and a second embodiment.

DETAILED DESCRIPTION

In general, according to one embodiment, a magnetic memory device includes: a semiconductor substrate; a first lower area provided on the semiconductor substrate, and including a plurality of magnetoresistive effect elements; a second lower area provided on the semiconductor substrate, and being adjacent to the first lower area; a first upper area prodded above the first lower area, and including a first material film formed of an insulating material or a semiconductor material; and a second upper area provided above the second lower area, being adjacent to the first upper area, and including a second material film formed of an insulating material different from a material of the first material film.

Embodiments will be described hereinafter with reference to the accompanying drawings.

Embodiment 1

Figure 1:
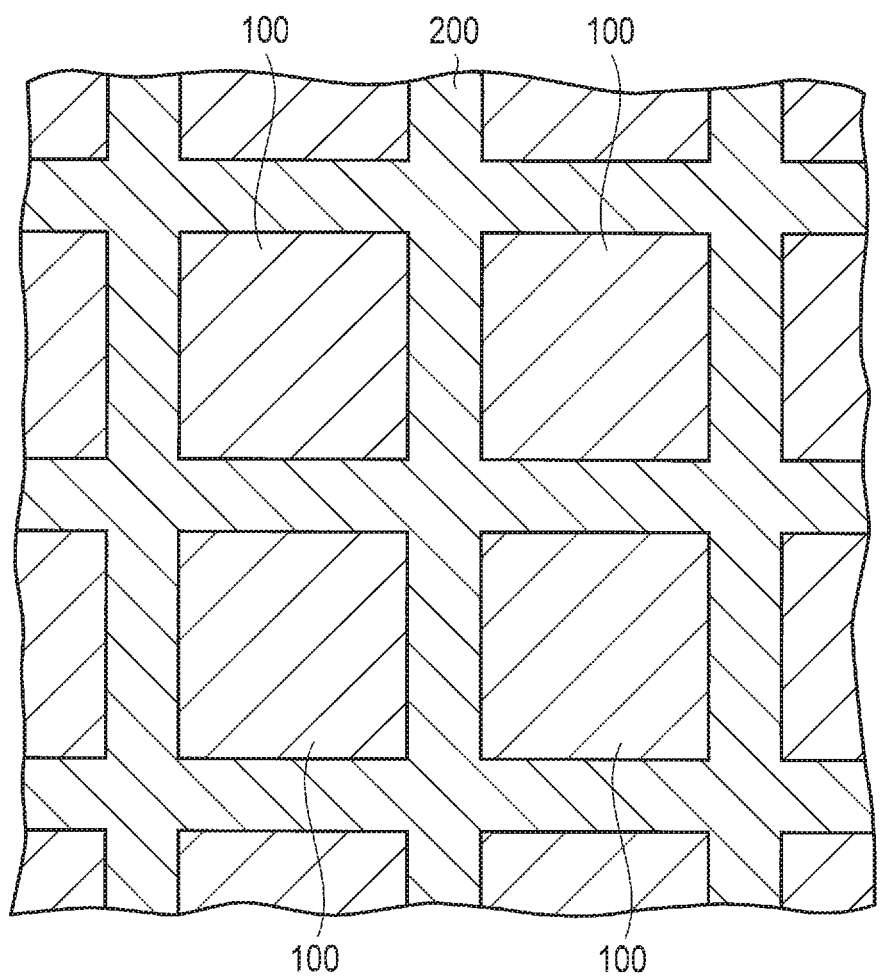
FIG. 1 is an illustration which schematically shows a cell array area and a peripheral area of a magnetic memory device according to a first embodiment.

FIG. 1 is an illustration which schematically shows a cell array area and a peripheral area of a magnetic memory device (semiconductor integrated circuit device) according to the present embodiment.

As shown in FIG. 1, the magnetic memory device of the present embodiment comprises a plurality of cell array areas (first areas) 100, and a peripheral area (second area) 200 which is adjacent to the cell array areas 100 and surrounds the cell array areas 100. In each of the cell array areas 100, a plurality of magnetoresistive effect elements used as storage elements are arranged as an array. Also, in each of the cell array areas 100, a plurality of select transistors for selecting a desired magnetoresistive effect element are provided. Note that the magnetoresistive effect element is also called a magnetic tunnel junction (MTJ) element. The peripheral area 200 includes a peripheral circuit including a circuit, etc., which performs write and read operations with respect to the magnetoresistive effect element.

Figure 2:
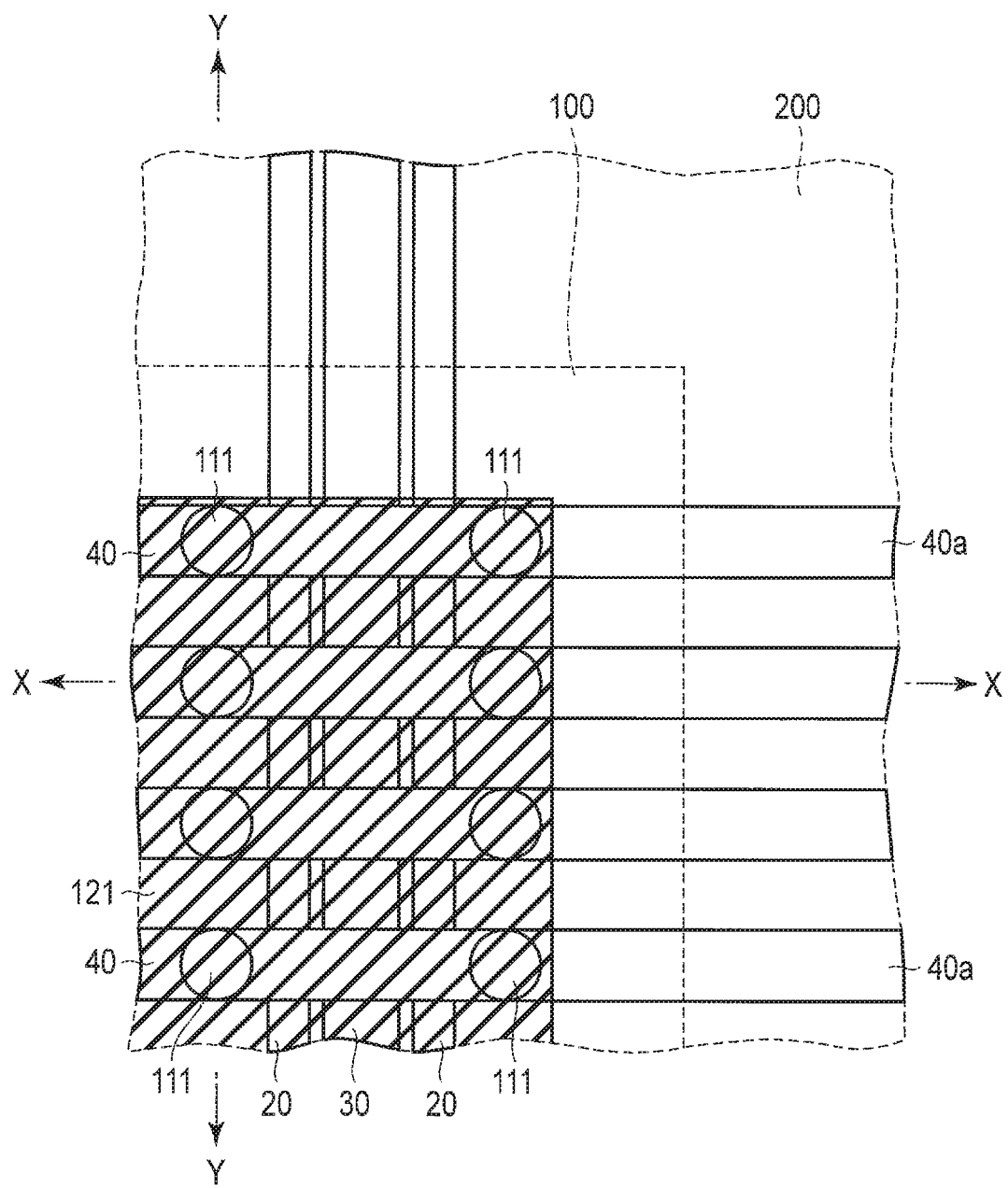
FIG. 2 is a plan view which schematically shows a structure of the magnetic memory device according to the first embodiment.
Figure 3:
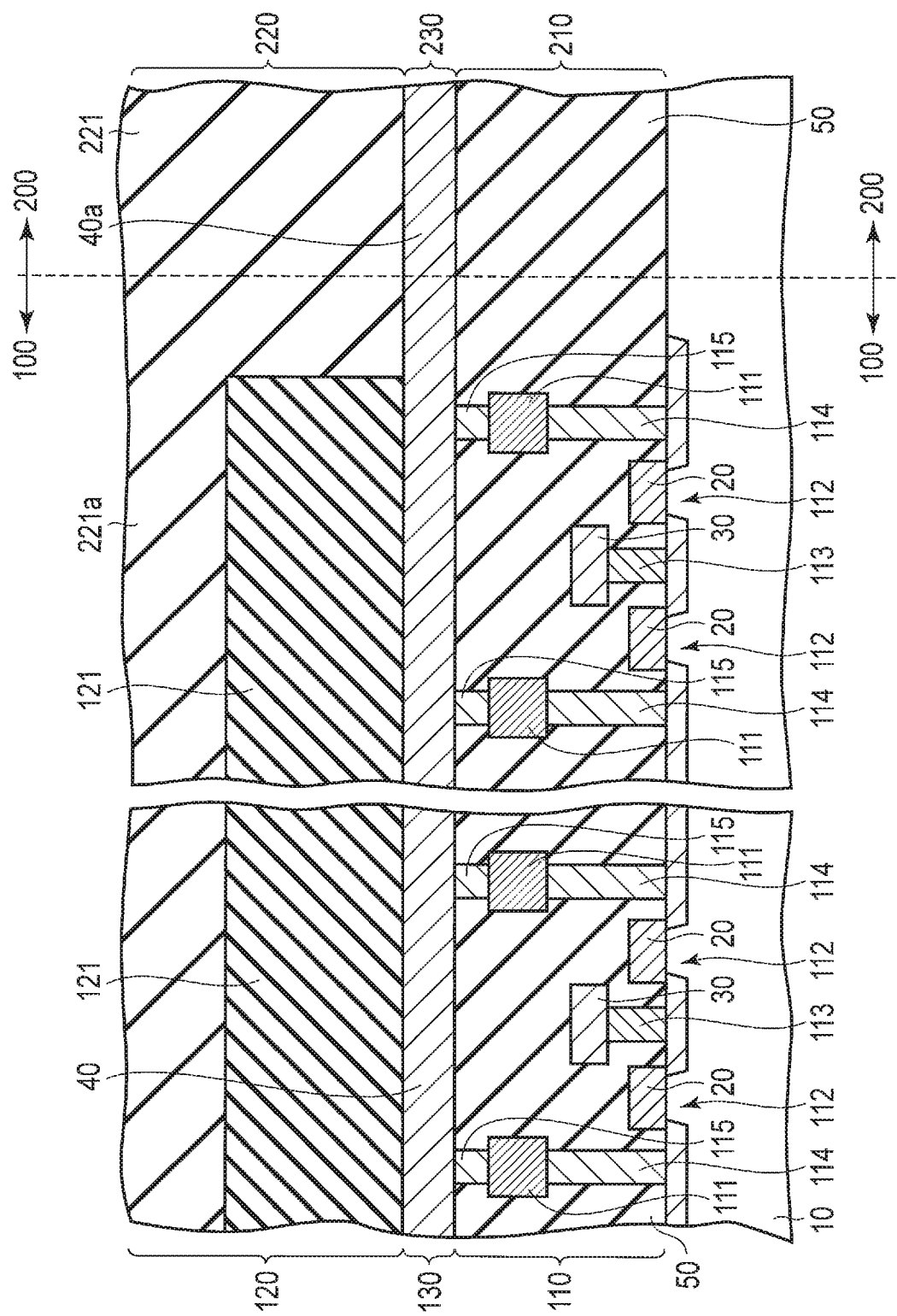
FIG. 3 is a cross-sectional view which schematically shows a structure of the magnetic memory device according to the first embodiment.

FIG. 2 is a plan view which schematically shows the structure of the magnetic memory device according to the present embodiment. FIG. 3 is a cross-sectional view which schematically shows the structure of the magnetic memory device according to the present embodiment (corresponding to a cross-section taken along line X-X of FIG. 2). FIG. 4 is a cross-sectional view which schematically shows the structure of the magnetic memory device according to the present embodiment (corresponding to a cross-section taken along line Y-Y of FIG. 2). Further, FIG. 4 does not illustrate an area on a lower layer side including the transistors, etc.

On a semiconductor substrate 10, a first lower area 110, and a second lower area 210 adjacent to the first lower area 110 are provided. The first lower area 110 is included in the cell array area (the first area) 100, and the second lower area 210 is included in the peripheral area (the second area) 200. Accordingly, the first lower area 110 is surrounded by the second lower area 210.

In the first lower area 110, a plurality of magnetoresistive effect elements 111 arranged as an array, and a plurality of select transistors 112 for selecting a desired magnetoresistive effect element 111 are provided. A gate electrode of the select transistor 112 serves as a word line 20. A source line 30 is connected to the source of the select transistor 112 via a plug 113. A terminal on one side of the magnetoresistive effect element 111 is connected to the drain of the select transistor 112 via a plug 114. A bit line 40 is connected to a terminal on the other side of the magnetoresistive effect element 111 via a plug 115.

FIG. 5 is a cross-sectional view which schematically shows a basic structure of the magnetoresistive effect element 111 according to the present embodiment.

The magnetoresistive effect element (MTJ element) 111 is a spin transfer torque (SIT) magnetoresistive effect element, and includes a first magnetic layer (storage layer) 111a having a variable magnetization direction, a second magnetic layer (reference layer) 111b having a fixed magnetization direction, and a tunnel insulating layer (tunnel barrier layer) 111c provided between the first magnetic layer 111a and the second magnetic layer 111b.

The above-described storage layer 111a and reference layer 111b are both ferromagnetic layers having perpendicular magnetization. That is, the storage layer 111a has the magnetization direction which is perpendicular to a main surface of this layer, and the reference layer 111b has the magnetization direction which is perpendicular to a main surface of this layer.

The resistance of the magnetoresistive effect element 111 when the magnetization directions of the storage layer 111a and the reference layer 111b are parallel is lower than the resistance of the magnetoresistive effect element 111 when the magnetization directions of the storage layer 111a and the reference layer 111b are antiparallel. That is, when the magnetization directions of the storage layer 111a and the reference layer 111b are parallel, the magnetoresistive effect element 111 shows a low-resistance state, and when the magnetization directions of the storage layer 111a and the reference layer 111b are antiparallel, the magnetoresistive effect element 111 shows a high-resistance state. Accordingly, the magnetoresistive effect element 111 can store binary information. (0 or 1) in accordance with the resistance state (the low-resistance state or the high-resistance state). Also, the resistance state (the low- or the high-resistance state) can be set in accordance with the direction of a write current which flows through the magnetoresistive effect element.

The second lower area 210 includes, for example, a transistor for the peripheral circuit including the circuit, etc., which performs write and read operations with respect to the magnetoresistive effect element 111.

The first lower area 110 and the second lower area 210 include an insulating area 50 including an interlayer insulating film, and the magnetoresistive effect elements 111, etc., are surrounded by the insulating area 50. As the material of the insulating area 50, silicon oxide (SiO) is mainly used.

Above the first lower area 110, a first upper area 120 is provided. Also, above the second lower area 210, a second upper area 220 is provided adjacent to the first upper area 120. The first upper area 120 is included in the cell array area (the first area) 100, and the second upper area 220 is included in the peripheral area (the second area) 200. Accordingly, the first upper area 120 is surrounded by the second upper area 220.

The first upper area 120 includes a first material film 121 formed of an insulating material or a semiconductor material. The second upper area 220 includes a second material film 221 formed of an insulating material different from the material of the first material film 121.

The first material film 121 has thermal conductivity which is higher than that of the second material film 221. In addition, the first material film 121 has thermal conductivity which is higher than that of the insulating area 50. More specifically, for the material of the first material film 121, aluminum nitride (AlN), which is an insulating material having high thermal conductivity, is used. Silicon carbide (SiC), which is a semiconductor material having high thermal conductivity may be used instead of aluminum nitride (AlN). Also, for the material of the second material film 221, silicon oxide (SiO), which as an insulating material, is used.

The first material film 121 is provided above at least the plurality of magnetoresistive effect elements 111. In the present embodiment, the first material film. 121 is formed of a continuous film covering the plurality of magnetoresistive effect elements 111. That is, the first material film 121 is provided for each of the first upper areas 120 (the cell array areas 100), and continuously covers the entirety of the plurality of magnetoresistive effect elements 111 included in each of the first lower areas 110.

The second material film 221 serves as an interlayer insulating film, and extends to the first upper area 120. Further, the first material film. 121 contacts an extending portion 221a of the second material film 221.

A first interconnect area 130 including a plurality of interconnects is provided between the first lower area 110 and the first upper area 120. The first interconnect area 130 is formed directly on the first lower area 110, and the first upper area 120 is formed directly on the first interconnect area 130. In the present embodiment, the plurality of interconnects included in the first interconnect area 130 are the bit lines 40 already described. Each of the plurality of interconnects (bit lines 40) is electrically connected to corresponding ones of the plurality of magnetoresistive effect elements 111. In the present embodiment, each of the plurality of bit lines 40 is electrically connected to the plurality of magnetoresistive effect elements 111 arranged in one direction.

A second interconnect area 230 including extending portions 40a of the plurality of interconnects (bit lines 40) described above is provided between the second lower area 210 and the second upper area 220. The second interconnect area 230 is formed directly on the second lower area 210, and the second upper area 220 is formed directly on the second interconnect area 230. Accordingly, the first interconnect area 130 and the second interconnect area 230 exist within the same layer (i.e., the same interconnect layer). The extending portions 40a of the respective bit lines 40 are connected to the circuit for write and read operations provided in the peripheral area 200.

As described above, in the magnetic memory device according to the present embodiment, the first upper area 120 includes the first material film 121 formed of an insulating material or a semiconductor material. The first material film 121 has thermal conductivity which is higher than the thermal conductivity of the second material film 221 included in the second upper area 220 and the thermal conductivity of the insulating area 50 included in the first lower area 110. Accordingly, heat produced in the magnetoresistive effect elements 111 can be removed efficiently by the first material film 121. Additional explanation will be provided below.

In an STT magnetoresistive effect element, it is necessary to pass a large current at the time of writing. Accordingly, great Joule heat is produced in the tunnel barrier layer, and the temperature of the magnetoresistive effect element is raised. In particular, if the size of the magnetoresistive effect element is reduced, a rise in temperature of the magnetoresistive effect element becomes steep. As a result, a dielectric breakdown life of the magnetoresistive effect element is shorted.

In the present embodiment, above the first lower area 110 in which the magnetoresistive effect elements 111 are provided, the first upper area 120 including the first material film 121 having high thermal conductivity is provided. Consequently, heat produced in the magnetoresistive effect elements 111 can be efficiently dissipated by the first material film 121, and it becomes possible to suppress a rise in temperature of the magnetoresistive effect elements 111. As a result, it becomes possible to suppress shortening of the dielectric breakdown life of the magnetoresistive effect elements 111, and a good magnetic memory device can be obtained.

Also, in the present embodiment, what is provided between the first lower area 110 in which the magnetoresistive effect elements 111 are included and the first upper area 120 in which the first material film 121 is included is only the first interconnect area 130. Therefore, it becomes possible to reduce a distance between the magnetoresistive effect elements 111 and the first material film 121, and heat produced in the magnetoresistive effect elements 111 can be efficiently removed.

Also, in the present embodiment, the first material film 121 is provided above the first lower area 110 in which the magnetoresistive effect elements 111 and the select transistors 112 are included. Accordingly, the first material film 121 can be arranged without greatly affecting the layout of the magnetoresistive effect elements 111 and the select transistors 112.

Further, in the embodiment described above, while the first material film 121 is formed of a continuous film covering the plurality of magnetoresistive effect elements 111, it is sufficient if the first material film 121 is provided above at least the plurality of magnetoresistive effect elements 111. Therefore, the first material film 121 may be divided into a plurality of portions.

Embodiment 2

Next, a magnetic memory device (semiconductor integrated circuit device) according to a second embodiment will be described. Since the basic matters are the same as those of the first embodiment, matters already described in the first embodiment will be omitted from the explanation.

Figure 6:
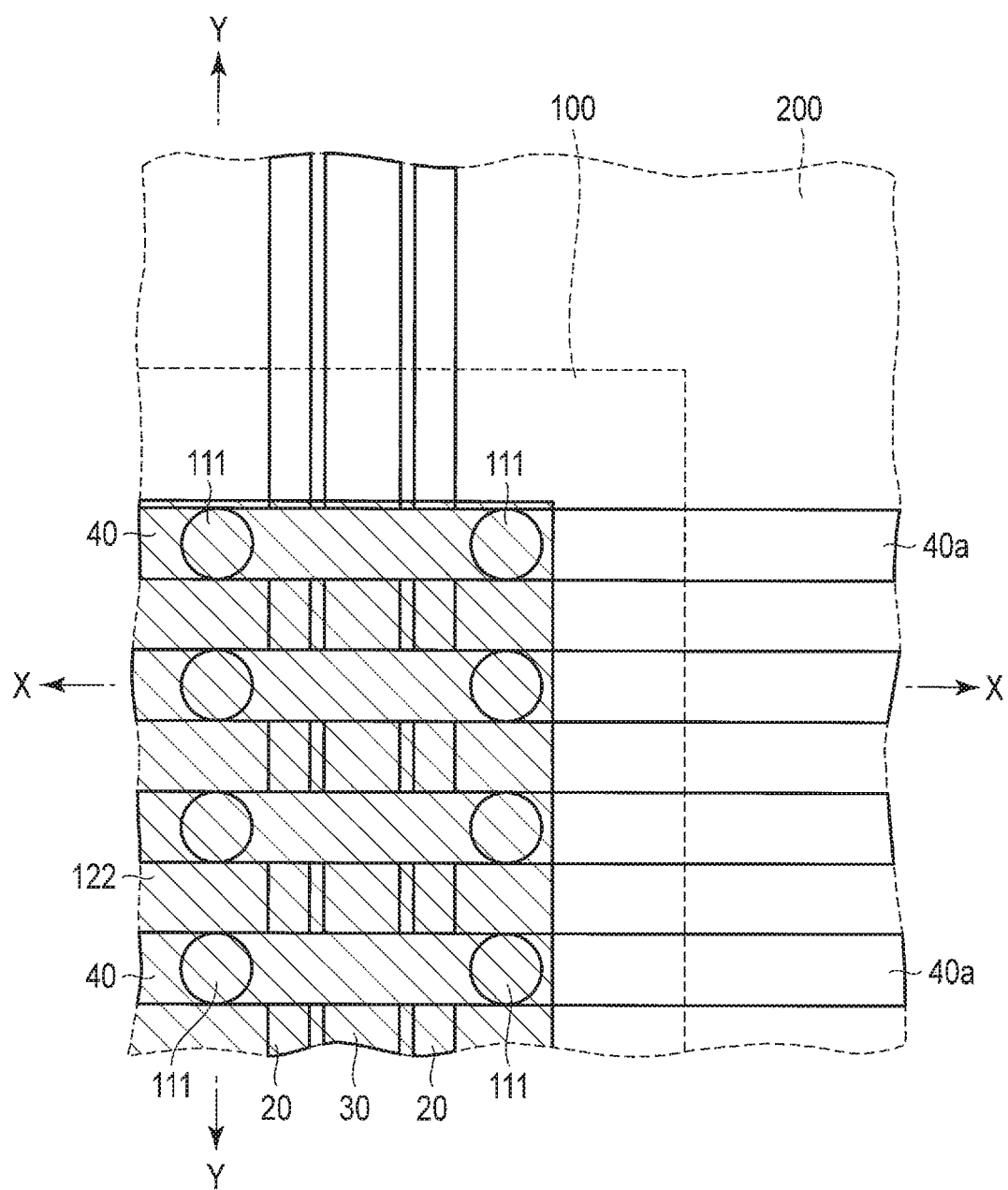
FIG. 6 is a plan view which schematically shows a structure of a magnetic memory device according to the second embodiment.
Figure 7:
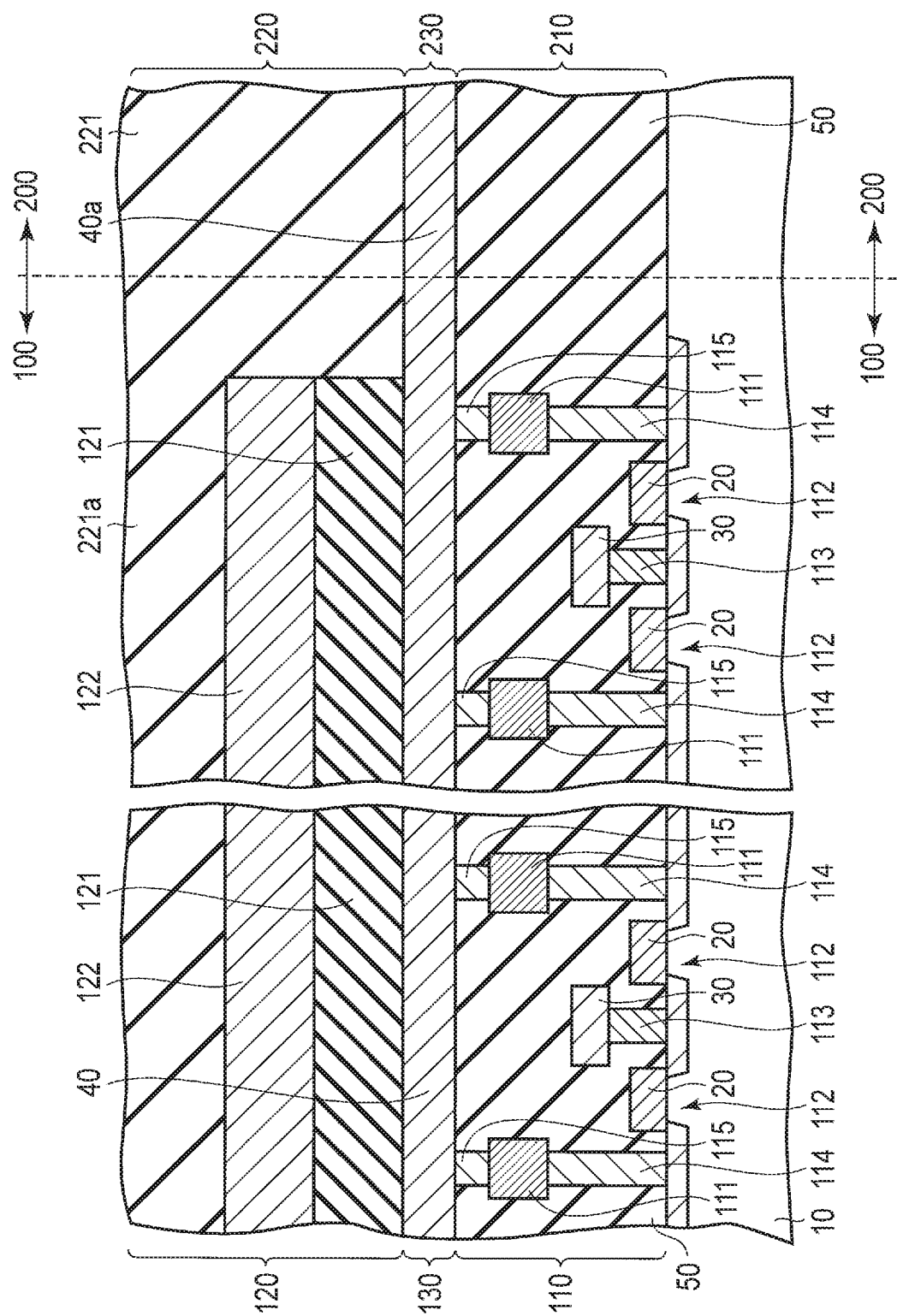
FIG. 7 is a cross-sectional view which schematically shows a structure of the magnetic memory device according to the second embodiment.
Figure 8:
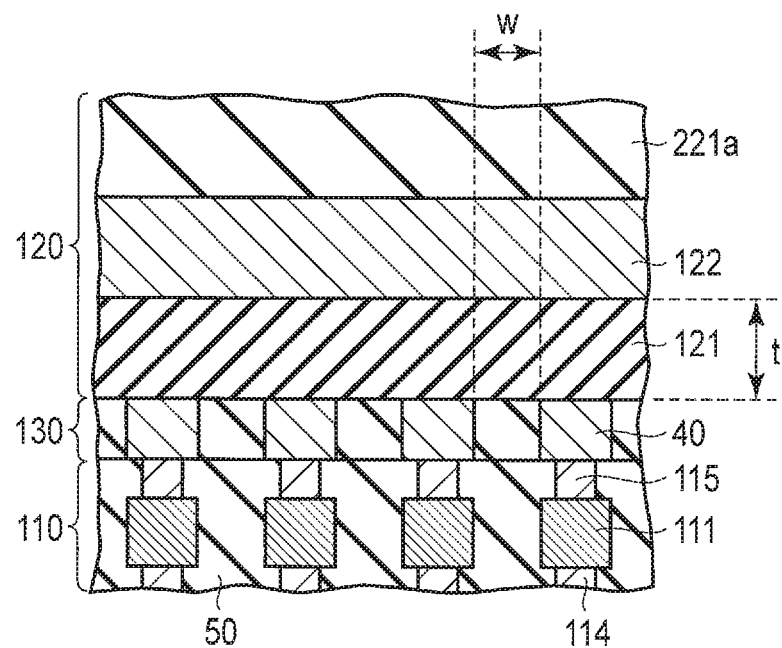
FIG. 8 is a cross-sectional view which schematically shows a structure of the magnetic memory device according to the second embodiment.

FIG. 6 is a plan view which schematically shows the structure of the magnetic memory device according to the present embodiment. FIG. 7 is a cross-sectional view which schematically shows the structure of the magnetic memory device according to the present embodiment (corresponding to a cross-section taken along line X-X of FIG. 6). FIG. 8 is a cross-sectional view which schematically shows the structure of the magnetic memory device according to the present embodiment (corresponding to a cross-section taken along line Y-Y of FIG. 6). Note that FIG. 8 does not illustrate an area on a lower layer side including transistors, etc.

In the present embodiment, a first upper area 120 further includes a third material film 122 provided on a first material film 121 and made of a metal material. Generally, metal materials have high thermal conductivity. Accordingly, the third material film 122 has thermal conductivity which is higher than that of the first material film 121 and a second material film 221. More specifically, for the material of the third material film 122, copper (Cu), aluminum (Al), or tungsten (W), which are metal materials having high thermal conductivity, is used.

As in the first embodiment, the first material film 121 is formed of an insulating material or a semiconductor material having high thermal conductivity. Also, the basic structure of the first material film 121 is the same as that of the first embodiment, and the first material film 121 is formed of a continuous film covering a plurality of magnetoresistive effect elements 111.

The third material film 122 is provided above at least the plurality of magnetoresistive effect elements 111. In the present embodiment, the third material film 122 is formed of a continuous film covering the plurality of magnetoresistive effect elements 111. That is, the third material film 122 is provided for each of the first upper areas 120 (cell array areas 100), and continuously covers the entirety of the plurality of magnetoresistive effect elements 111 included in each of first lower areas 110.

Also, the third material film 122 is electrically isolated. That is, the third material film 122 is not electrically connected to either of a circuit within the magnetic memory device (the semiconductor integrated circuit device) and a circuit outside the magnetic memory device (the semiconductor integrated circuit device).

As described above, also in the magnetic memory device according to the present embodiment, the first upper area 120 includes the first material film 121 as in the first embodiment. Further, in the present embodiment, the first upper area 120 includes the third material film 122 formed of a metal material. The third material film 122 has thermal conductivity which is higher than that of the first material film 121 and the second material film 221. Accordingly, heat produced in the magnetoresistive effect elements 111 is transmitted to the third material film 122 via the first material film 121, and the transmitted heat can be removed efficiently by the third material film 122.

Also, in the present embodiment, as shown in FIG. 8, the relationship that $\varepsilon_a/t$ is less than $\varepsilon_b/w$ or equal to $\varepsilon_b/w$ is satisfied, t and $\varepsilon_a$ respectively being the thickness and relative dielectric constant of the first material film 121, and w and $\varepsilon_b$ respectively being the width and relative dielectric constant of an insulating portion between adjacent interconnects of the plurality of interconnects (bit lines 40). For example, when aluminum nitride (AlN) is used for the first material film 121, and silicon oxide (SiO) is used for the material of the insulating portion between adjacent interconnects (the bit lines 40), the thickness t of the aluminum nitride (AlN) should preferably be greater than approximately twice the width w of the silicon oxide (SiO).

Generally, a material having high thermal conductivity tends to have a high dielectric constant. Therefore, a parasitic capacitance between the third material film 122 and the interconnects (the bit lines 40) may raise a problem when the thickness t of the first material film 121 is small. By adjusting the thickness t of the first material film 121 in order to satisfy the aforementioned relationship, the parasitic capacitance between the third material film 122 and the interconnects (the bit lines 40) can be made relatively small, and the influence of the parasitic capacitance can be suppressed.

Next, a magnetic memory device (semiconductor integrated circuit device) according to a modification of the present embodiments will be described. The basic matters of this modification are the same as those of the embodiments described above, and thus a description of the same matters will be omitted.

Figure 9:
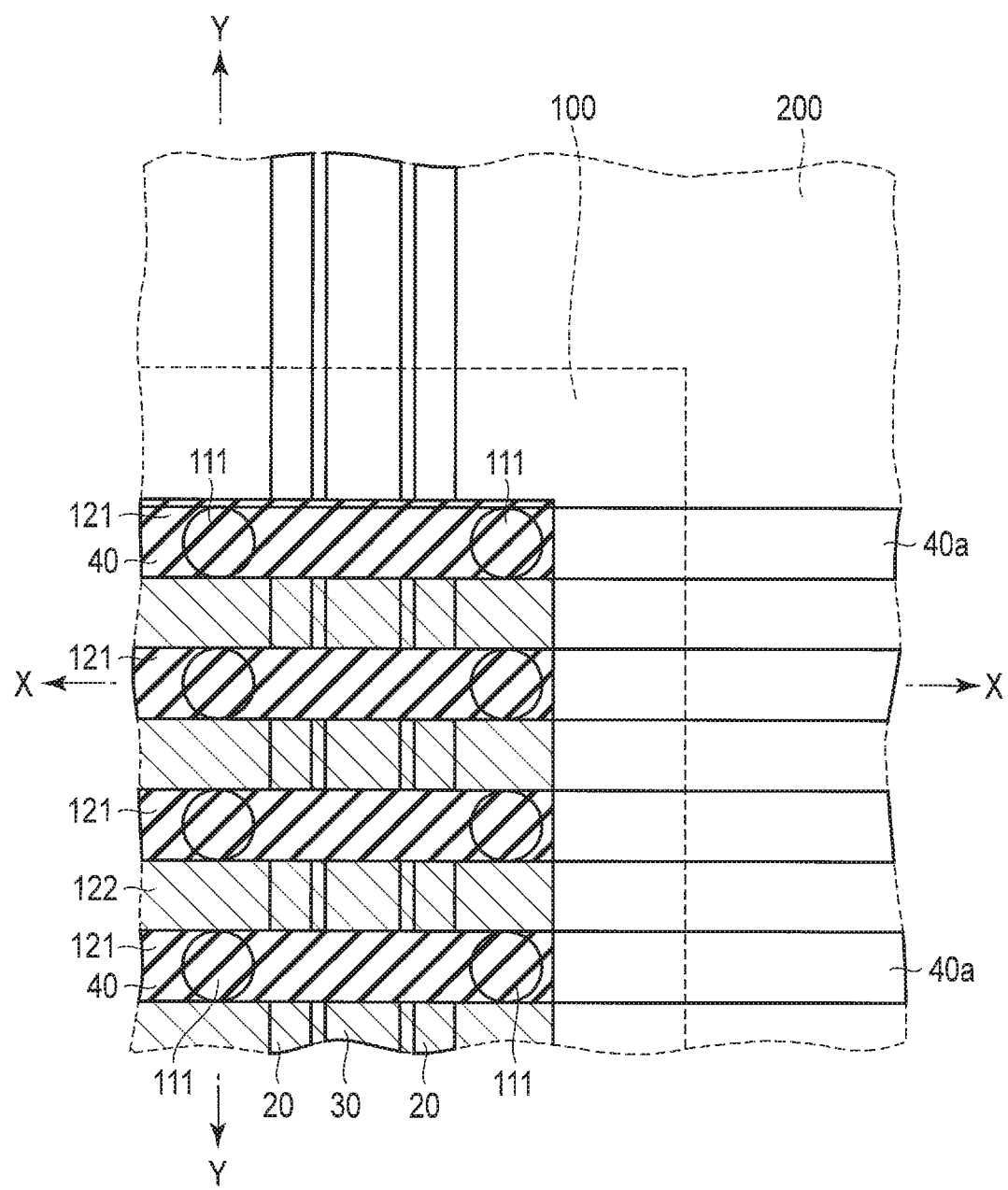
FIG. 9 is a plan view which schematically shows a structure of a magnetic memory device according to a modification of the second embodiment.
Figure 10:
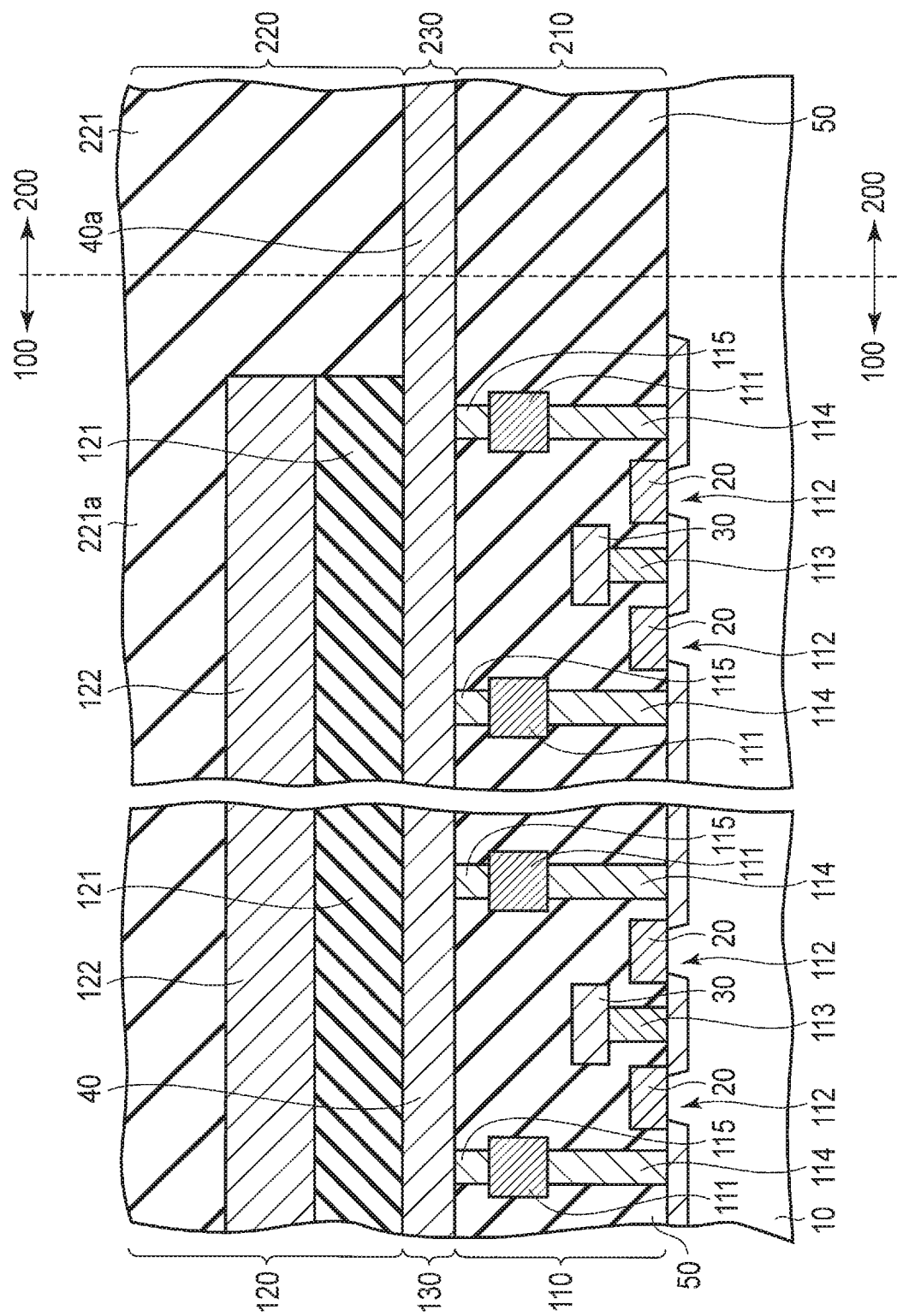
FIG. 10 is a cross-sectional view which schematically shows a structure of the magnetic memory device according to the modification of the second embodiment.
Figure 11:
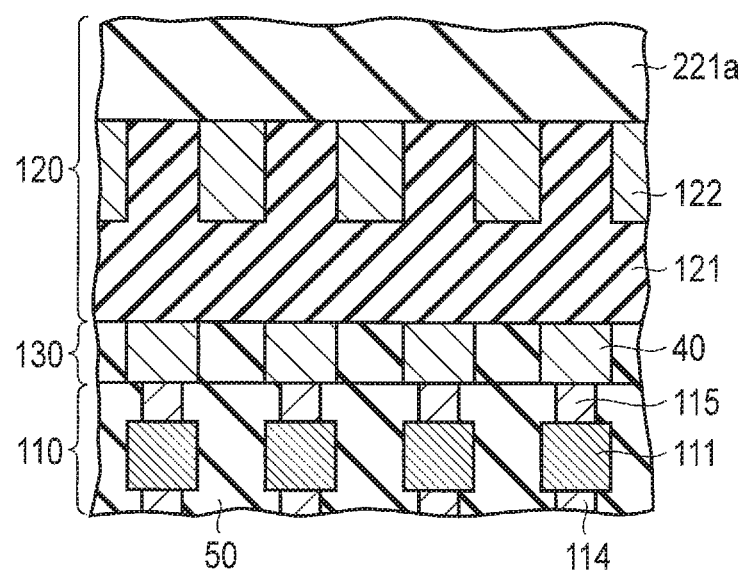
FIG. 11 is a cross-sectional view which schematically shows a structure of the magnetic memory device according to the modification of the second embodiment.

FIG. 9 is a plan view which schematically shows the structure of the magnetic memory device according to the present modification. FIG. 10 is a cross-sectional view which schematically shows the structure of the magnetic memory device according to the present modification (corresponding to a cross-section taken along line X-X of FIG. 9). FIG. 11 is a cross-sectional view which schematically shows the structure of the magnetic memory device according to the present embodiment (corresponding to a cross-section taken along line Y-Y of FIG. 9). Note that FIG. 11 does not illustrate an area on a lower layer side including transistors, etc.

In the present modification, the third material film 122 is divided into a plurality of portions extending in the same direction. More specifically, the third material film 122 is provided on a portion of the first material film. 721 located on an area between adjacent interconnects (the bit lines 40), and extends in the same direction as the extending direction of the interconnects (the bit lines 40). That is, as viewed from a direction perpendicular to a main surface of the semiconductor substrate 10, the third material film 122 and the interconnect (the bit line 40) are arranged alternately. Further, the basic structure of the first material film 121 is the same as that of the first embodiment, and the first material film 121 is formed of a continuous film covering a plurality of magnetoresistive effect elements 111.

In the present modification, since the third material film 122 and the interconnect (the bit line 40) are arranged alternately, the third material film 122 and the interconnect (the bit line 40) do not overlap one another, or an overlapping portion of the third material film 122 and the interconnect (the bit line 40) is small. Accordingly, as compared to the above embodiments, the present modification can reduce a parasitic capacitance between the third material film 122 and the interconnects (the bit lines 40), and further suppress the influence of the parasitic capacitance.

It should be noted that in the first and second embodiments described above, the structures of the first upper area 120 and the second upper area 220, in particular, the structures of the first material film 121 and the third material film 122, can be changed variously in accordance with the structure on the lower layer side (i.e., the first lower area 110, the second lower area 210, the first interconnect area 130, and the second interconnect area 230). For example, the structures of the first upper area 120 and the second upper area 220 can be changed as appropriate also for various structures on the lower layer side as described in U.S. Pat. No. 8,513,751 B2, and US 2014/0284738 A1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device, comprising:
    a semiconductor substrate;
    a first lower area provided on the semiconductor substrate, and including a plurality of magnetoresistive effect elements;
    a second lower area provided on the semiconductor substrate, being adjacent to the first lower area, and not overlapping with the first lower area along a thickness direction;
    a first upper area provided above the first lower area, and including a first material film formed of a first material, the first material being a first insulating material or a semiconductor material; and
    a second upper area provided above the second lower area, being adjacent to the first upper area, and including a second material film formed of a second insulating material different from the first material,
    wherein the second material film extends to the first upper area, and the first material film is provided between the first lower area and an extending portion of the second material film such that only the extending portion of the second material film overlaps with the first material film along the thickness direction, and a non-extending portion of the second material film does not overlap with the first material film along the thickness direction, and
    wherein the extending portion of the second material film covers an entirety of the first material film when viewed in a plan view.

2. The magnetic memory device of claim 1, wherein a thermal conductivity of the first material film is higher than a thermal conductivity of the second material film.

3. The magnetic memory device of claim 1, wherein the first material film is provided at least above the plurality of magnetoresistive effect elements.

4. The magnetic memory device of claim 1, wherein the first material film is formed of a continuous film covering the plurality of magnetoresistive effect elements.

5. The magnetic memory device of claim 1, wherein the first material film is in contact with the extending portion of the second material film.

6. The magnetic memory device of claim 1, further comprising a first interconnect area provided between the first lower area and the first upper area, and including a plurality of interconnects.

7. The magnetic memory device of claim 6, further comprising a second interconnect area provided between the second lower area and the second upper area, and including respective extending portions of the plurality of interconnects.

8. The magnetic memory device of claim 7, wherein the first interconnect area and the second interconnect area exist within a same layer.

9. The magnetic memory device of claim 6, wherein each of the plurality of interconnects is electrically connected to corresponding ones of the plurality of magnetoresistive effect elements.

10. The magnetic memory device of claim 1, wherein:
    the first lower area further includes an insulating area surrounding the plurality of magnetoresistive effect elements; and
    a thermal conductivity of the first material film is higher than a thermal conductivity of the insulating area.

11. The magnetic memory device of claim 1, wherein the first material film is formed of aluminum nitride or silicon carbide.

12. The magnetic memory device of claim 1, wherein the second material film is formed of silicon oxide.

13. A magnetic memory device, comprising:
    a semiconductor substrate;
    a first lower area provided on the semiconductor substrate, and including a plurality of magnetoresistive effect elements;
    a second lower area provided on the semiconductor substrate, being adjacent to the first lower area, and not overlapping with the first lower area along a thickness direction;
    a first upper area provided above the first lower area, and including a first material film formed of a first material, the first material being a first insulating material or a semiconductor material;
    a second upper area provided above the second lower area, being adjacent to the first upper area, and including a second material film formed of a second insulating material different from the first material; and a first interconnect area provided between the first lower area and the first upper area, and including a plurality of interconnects, wherein the second material film extends to the first upper area, and the first material film is provided between the first lower area and an extending portion of the second material film, wherein the plurality of interconnects are in physical contact with the first material film and a non-extending portion of the second material film, and wherein the first lower area, the first interconnect area and the first upper area are stacked in that order in the thickness direction.

14. The magnetic memory device of claim 13, wherein a thermal conductivity of the first material film is higher than a thermal conductivity of the second material film.

15. The magnetic memory device of claim 13, wherein the first material film is provided at least above the plurality of magnetoresistive effect elements.

16. The magnetic memory device of claim 13, wherein the first material film is formed of a continuous film covering the plurality of magnetoresistive effect elements.

17. The magnetic memory device of claim 13, wherein the first material film is in contact with the extending portion of the second material film.

18. The magnetic memory device of claim 13, further comprising a second interconnect area provided between the second lower area and the second upper area, and including respective extending portions of the plurality of interconnects.

19. The magnetic memory device of claim 18, wherein the first interconnect area and the second interconnect area exist within a same layer.

20. The magnetic memory device of claim 13, wherein each of the plurality of interconnects is electrically connected to corresponding ones of the plurality of magnetoresistive effect elements.

21. The magnetic memory device of claim 13, wherein:
the first lower area further includes an insulating area surrounding the plurality of magnetoresistive effect elements; and
a thermal conductivity of the first material film is higher than a thermal conductivity of the insulating area.

22. The magnetic memory device of claim 13, wherein the first material film is formed of aluminum nitride or silicon carbide.

23. The magnetic memory device of claim 13, wherein the second material film is formed of silicon oxide.

24. The magnetic memory device of claim 1, wherein no interconnects are provided in the first upper area.

25. The magnetic memory device of claim 13, wherein no interconnects are provided in the first upper area.

26. The magnetic memory device of claim 13, wherein an entirety of the first material film is located higher than the plurality of interconnects in the thickness direction.

* * * * *